US009349960B2

(12) United States Patent
Heun et al.

(10) Patent No.: US 9,349,960 B2
(45) Date of Patent: May 24, 2016

(54) COMPOUNDS AND POLYMERS WHICH CONTAIN SUBSTITUTED INDENOFLUORENE DERIVATIVES AS STRUCTURAL UNIT, PROCESS FOR THE PREPARATION THEREOF, AND THE USE THEREOF AS ELECTRONIC DEVICES AND MIXTURES AND SOLUTIONS

(75) Inventors: Susanne Heun, Bad Soden (DE); Aurélie Ludemann, Frankfurt am Main (DE); Rémi Manouk Anémian, Frankfurt (DE); Junyou Pan, Frankfurt (DE); Thomas Eberle, Landau (DE)

(73) Assignee: Merck Patent GmbH (DE)

( * ) Notice: Subject to any disclaimer, the term of this patent is extended or adjusted under 35 U.S.C. 154(b) by 397 days.

(21) Appl. No.: 13/266,781

(22) PCT Filed: May 3, 2010

(86) PCT No.: PCT/EP2010/002684
§ 371 (c)(1),
(2), (4) Date: Oct. 28, 2011

(87) PCT Pub. No.: WO2010/136110
PCT Pub. Date: Dec. 2, 2010

(65) Prior Publication Data
US 2012/0061617 A1 Mar. 15, 2012

(30) Foreign Application Priority Data
May 29, 2009 (DE) .......................... 10 2009 023 156

(51) Int. Cl.
| H01L 51/54 | (2006.01) |
| C09K 11/06 | (2006.01) |
| H01L 51/00 | (2006.01) |
| C08G 61/02 | (2006.01) |
| C08G 61/12 | (2006.01) |
| C09B 69/10 | (2006.01) |
| H05B 33/14 | (2006.01) |
| H01L 51/50 | (2006.01) |

(52) U.S. Cl.
CPC ............ *H01L 51/0039* (2013.01); *C08G 61/02* (2013.01); *C08G 61/12* (2013.01); *C08G 61/124* (2013.01); *C09B 69/103* (2013.01); *C09B 69/109* (2013.01); *C09K 11/06* (2013.01); *H01L 51/0043* (2013.01); *H05B 33/14* (2013.01); *C08G 2261/3142* (2013.01); *C08G 2261/3241* (2013.01); *C08G 2261/374* (2013.01); *C08G 2261/411* (2013.01); *C08G 2261/524* (2013.01); *C09K 2211/1416* (2013.01); *C09K 2211/1425* (2013.01); *H01L 51/0037* (2013.01); *H01L 51/0085* (2013.01); *H01L 51/5016* (2013.01); *Y02E 10/549* (2013.01)

(58) Field of Classification Search
None
See application file for complete search history.

(56) References Cited

U.S. PATENT DOCUMENTS

| 7,754,841 B2 | 7/2010 | O'Dell et al. |
| 2006/0046092 A1 | 3/2006 | Towns et al. |
| 2008/0220285 A1 | 9/2008 | Vestweber et al. |
| 2009/0184313 A1 | 7/2009 | Buesing et al. |

FOREIGN PATENT DOCUMENTS

| JP | 2000104057 A | * | 4/2000 | ............. C09K 11/06 |
| JP | 2006517595 A | | 7/2006 | |
| JP | 2008530254 A | | 8/2008 | |
| WO | WO-0204543 A1 | | 1/2002 | |
| WO | WO-2004/113412 A2 | | 12/2004 | |
| WO | WO-2006/122630 A1 | | 11/2006 | |
| WO | WO-2007/140847 A1 | | 12/2007 | |
| WO | WO-2008/011953 A1 | | 1/2008 | |
| WO | WO-2009038413 A2 | | 3/2009 | |

OTHER PUBLICATIONS

Machine translation of JP2000-104057. Date of publication: Apr. 11, 2000.*
International Search Report dated Jun. 4, 2011 of PCT application PCT/EP2010/002684.
Japanese office action for corresponding Japanese patent application No. 2012-512226 mailed Jun. 17, 2014.

* cited by examiner

*Primary Examiner* — Andrew K Bohaty
(74) *Attorney, Agent, or Firm* — Drinker Biddle & Reath LLP

(57) ABSTRACT

The present invention relates to polymers which contain substituted indenofluorene derivatives as structural unit, to substituted indenofluorene derivatives, to a process for the preparation of the polymers according to the invention, to mixtures and solutions which comprise the polymers according to the invention, and to the use of the polymers according to the invention in electronic devices, in particular in organic electroluminescent devices, so-called OLEDs (OLED=organic light emitting diode).

24 Claims, 2 Drawing Sheets

US 9,349,960 B2

COMPOUNDS AND POLYMERS WHICH CONTAIN SUBSTITUTED INDENOFLUORENE DERIVATIVES AS STRUCTURAL UNIT, PROCESS FOR THE PREPARATION THEREOF, AND THE USE THEREOF AS ELECTRONIC DEVICES AND MIXTURES AND SOLUTIONS

CROSS-REFERENCE TO RELATED APPLICATIONS

This application is a national stage application (under 35 U.S.C. §371) of PCT/EP2010/002684, filed May 3, 2010, which claims benefit of German application 10 2009 023 156.0, filed May 29, 2009.

BACKGROUND OF THE INVENTION

The present invention relates to polymers which contain substituted indenofluorene derivatives as structural unit, to substituted indenofluorene derivatives, to a process for the preparation of the polymers according to the invention, to mixtures (also known as blends) and solutions which comprise the polymers according to the invention, and to the use of the polymers according to the invention in electronic devices, in particular in organic electroluminescent devices, so-called OLEDs (OLED=organic light emitting diode).

In the past, predominantly small molecules were employed as useful components, for example as phosphorescence emitters, in organic electroluminescent devices. The use of small molecules in organic electroluminescent devices (SMOLEDs) enables good colour efficiencies, long lifetimes and the requisite low operating voltages. However, the disadvantage of such systems is the complex production. Thus, for example, the deposition of layers of small molecules requires complex processes, such as, for example, thermal coating processes, which results in a limited maximum device size.

For some time, conjugated polymers having the corresponding properties have therefore been used for opto-electronic applications, since they can be applied easily and inexpensively as a layer by rotation coating or print coating. In addition, systems of this type usually have a long lifetime. Conjugated polymers have already been investigated intensively for some time as highly promising materials in OLEDs. OLEDs which comprise polymers as organic materials are frequently also known as PLEDs (PLED=polymer light emitting diode). Their simple production holds the promise of inexpensive production of corresponding electroluminescent devices.

PLEDs consist either only of one layer, which is able to combine as far as possible all functions (charge injection, charge transport, recombination) of an OLED in itself, or they consist of a plurality of layers which comprise the respective functions individually or partially combined. For the preparation of polymers having the corresponding properties, the polymerisation is carried out using different monomers which take on the corresponding functions.

Thus, it is generally necessary for the generation of all three emission colours to copolymerise certain monomers into the corresponding polymers. In order to generate white light by light mixing, light in the three colours red, green and blue is required. In order to ensure high light efficiency, triplet emitters (phosphorescence) are preferred to weaker-light singlet emitters (fluorescence). Conjugated polymers are only suitable as host materials for red- or yellow-emitting triplet emitters, but not for triplet emitters having relatively high energy (blue- or green-emitting triplet emitters), since the low triplet energies of the conjugated polymers quench the emission from any triplet emitters having relatively high energy (relatively short wavelengths).

In order to circumvent the said problem of quenching, it is possible to employ non-conjugated or partially conjugated polymers. However, these have to date the disadvantage that the lifetime of such systems is unsatisfactory. Thus, for example, poly-N-vinylcarbazole is a known system for a triplet emitter in the green region. However, opto-electronic devices produced therefrom have extremely short lifetimes.

Thus, with the exception of triplet emitter polymers which emit in the deep-red region, no polymers having a long lifetime and high emission efficiency have been provided to date.

In order to solve this problem, WO 02/04543 has already proposed polymers whose conjugation is interrupted by the incorporation of diphenylfluorene into the polymer backbone. WO 05/061181, EP 1589595, WO 97/31048 and WO 97/20877 likewise propose spirobifluorene as conjugation-interrupting unit in the polymer backbone. However, polymers containing these units have low solubility in organic solvents. It is thus virtually impossible to use inexpensive production processes, such as rotation coating and print coating, for the production of organic electroluminescent devices.

BRIEF SUMMARY OF THE INVENTION

Accordingly, it was an object of the present invention to provide polymers and compounds which enable simple and inexpensive production of light-efficient (especially in the green and blue spectral regions) organic electroluminescent devices having long lifetimes.

This object is achieved in accordance with the invention by the provision of a polymer which contains at least one structural unit of the formula (I):

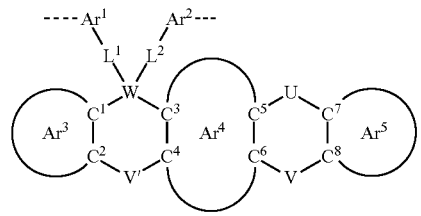

formula (I)

where the symbols and indices used have the following meanings:

the dashed lines represent, independently of one another, a bond to a further structural unit of the polymer;

$L^1$ and $L^2$ represent, independently of one another, a single covalent bond or a unit selected from the group consisting of a $C_{1-10}$-alkylene group, $C_{2-10}$-alkenylene group, $C_{2-10}$-alkynylene group and $Si_{1-10}$-silylene group, where one or more $CH_2$ units may be replaced by NR, O or S and one or more $SiH_2$ units may be replaced by O;

W represents a tetravalent unit selected from the group consisting of C, Si, Ge and a structural element of the following formulae (II) and (III):

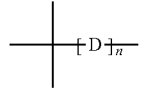

formula (II)

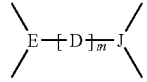

formula (III)

where D is, identically or differently on each occurrence, a unit selected from the group consisting of $CR_2$, O, S and NR, E and J are each, independently of one another, units selected from the group consisting of CR and N, n is 1, 2 or 3, and m is 0, 1 or 2;

where R is a radical selected from the group consisting of H, F and $C_{1-6}$-alkyl;

with the proviso that only one representative from E, D and J is different from CR or $CR_2$;

where, in the case where the tetravalent unit W is a unit of the formula (II) or (Ill), $C^1$ and $C^3$ are bonded to different atoms of the unit W;

U, V and V' represent, independently of one another, a single covalent bond or a divalent unit selected from the group consisting of $CR^1R^2$, C=O, $NR^1$, O, $SiR^1R^2$, P=O, S and $GeR^1R^2$;

where $R^1$ and $R^2$ are selected, independently of one another, from the group consisting of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;

$C^1$ to $C^8$ each represent a C atom;

$Ar^1$ and $Ar^2$ each represent, independently of one another, a 5- to 25-membered, optionally substituted aromatic or heteroaromatic ring system;

$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$.

A DETAILED DESCRIPTION OF THE INVENTION

Figure 1:
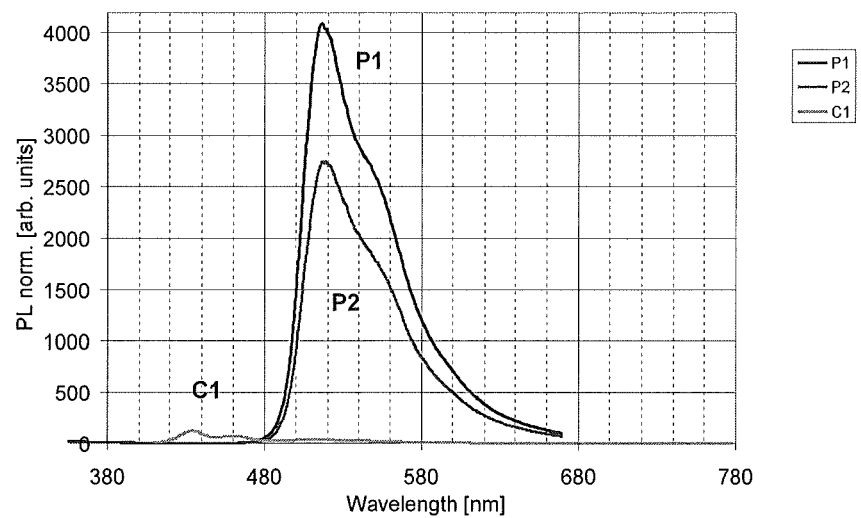
FIG. 1 illustrates a graph of P1, P2 and C1 showing the wave length and PL spectra.

It has been found that a polymer which contains at least one structural unit of the formula (I) can serve as host material for blue-, green- and red- (orange-) emitting triplet emitters, where the emission therefrom is not quenched, meaning that the high emission efficiency of the triplet emitters is retained. In addition, the solubility of the resultant polymers can be adjusted appropriately, in particular through the units U, V and V' of the formula (I), so that the application of layers of the polymers for organic electroluminescent devices can be achieved in a simple and inexpensive process.

For the purposes of the present invention, a $C_{1-6}$-alkyl group, a $C_{1-10}$-alkyl group and a $C_{1-40}$-alkyl group are taken to mean linear, branched or cyclic alkyl groups having 1 to 6, 1 to 10 or 1 to 40 carbon atoms respectively. In all three cases, preference is given to alkyl groups having 1 to 6 carbon atoms, particularly preferably 1 to 3 carbon atoms. One or more hydrogen atoms on these alkyl groups may preferably also have been replaced by a fluorine atom. In addition, one or more of the $CH_2$ groups in these units may have been replaced by NR, O or S (R here is a radical selected from the group consisting of H and $C_{1-6}$-alkyl). If one or more of the $CH_2$ groups have been replaced by NR, O or S, it is particularly preferred for only one of these groups to have been replaced; particularly preferably by an O atom. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl and 2,2,2-trifluoroethyl.

A $C_{2-10}$-alkenyl group or $C_{2-40}$-alkenyl group is taken to mean a linear, branched or cyclic alkenyl group having 2 to 10 or 2 to 40 carbon atoms respectively. One or more hydrogen atoms may have been replaced by a fluorine atom. In addition, one or more of the $CH_2$ groups in these units may have been replaced by NR, O or S (R here is a radical selected from the group consisting of H and $C_{1-6}$-alkyl). If one or more of the $CH_2$ groups have been replaced by NR, O or S, it is particularly preferred for only one of these groups to have been replaced. Examples thereof which may be mentioned are ethenyl, propenyl, butenyl, pentenyl, cyclopentenyl, hexenyl, cyclohexenyl, heptenyl, cycloheptenyl, octenyl and cyclooctenyl.

A $C_{2-10}$-alkynyl group or $C_{2-40}$-alkynyl group is taken to mean a linear or branched alkynyl group having 2 to 10 or 2 to 40 carbon atoms respectively. One or more hydrogen atoms may have been replaced by a fluorine atom. In addition, one or more of the $CH_2$ groups in these units may have been replaced by NR, O or S (R here is a radical selected from the group consisting of H and $C_{1-6}$-alkyl). If one or more of the $CH_2$ groups have been replaced by NR, O or S, it is particularly preferred for only one of these groups to have been replaced. Examples thereof which may be mentioned are ethynyl, propynyl, butynyl, pentynyl, hexynyl and octynyl.

For the purposes of the present invention, the term "5- to 25-membered, optionally substituted aromatic or heteroaromatic ring system" is taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C ($sp^3$-hybridised), N, O, Si, P, S, Ge (e.g.: $CR_2$, C=O, NR, O, $SiR_2$, P=O, S and $GeR_2$, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group. Thus, for example, systems such as 9,9'-spirobifluorene, 9,9-diarylfluorene and triarylamine are also intended to be taken to be aromatic ring systems.

The aromatic or heteroaromatic ring system may be monocyclic or polycyclic, i.e. it may have one ring (for example phenyl) or two or more rings, which may be condensed (for example naphthyl) or covalently linked (for example biphenyl), or contain a combination of condensed and linked rings. Fully conjugated ring systems are preferred.

Aromatic ring systems which are preferred in accordance with the invention are, for example, phenyl, biphenyl, triphenyl, [1,1':3',1'']terphenyl-2'-yl, naphthyl, anthracene, binaphthyl, phenanthrene, dihydrophenanthrene, pyrene, dihydropyrene, chrysene, perylene, tetracene, pentacene, benzo[a]pyrene, fluorene, indene, indenofluorene and spirobifluorene.

Heteroaromatic ring systems which are preferred in accordance with the invention are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene, or combinations of these groups.

A "$C_{6-40}$-aryl group" is taken to mean aromatic compounds having 6 to 40 aromatic carbon atoms. These aromatic compounds may be monocyclic or polycyclic, i.e. they may have one ring (for example phenyl) or two or more rings. In contrast to the aromatic ring systems mentioned above, the aryl groups include only condensed aromatic systems, i.e. compounds in which aromatic rings are covalently linked to one another (for example biphenyl) or are bonded to one another via further atoms (for example spirobifluorene) are intended to be excluded here. Preferred aryl groups are, for example, phenyl, naphthyl, anthracene, phenanthrene, pyrene, chrysene, perylene, tetracene, pentacene and benz[a]pyrene.

For the purposes of the present application, the term "5- to 25-membered heteroaryl group" is taken to mean an aromatic ring system having 5 to 25 atoms, where one or more of these atoms is a heteroatom. The heteroaryl groups may be monocyclic or polycyclic, i.e. they may have one ring or two or more rings. In contrast to the heteroaromatic ring systems mentioned above, the heteroaryl groups include only condensed aromatic systems, i.e. compounds in which aromatic rings are covalently linked to one another or are bonded to one another via further atoms are intended to be excluded here.

Preferred heteroaryl groups are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene, or combinations of these groups.

As mentioned above, the aromatic and heteroaromatic ring systems and aryl and heteroaryl groups may optionally have one or more substituents. These are preferably selected from the group consisting of silyl, sulfo, sulfonyl, formyl, amine, imine, nitrile, mercapto, nitro, halogen, $C_{1-12}$-alkyl, $C_{1-12}$-alkoxy, hydroxyl or combinations of these groups.

Preferred substituents are, for example, solubility-promoting groups, such as alkyl groups, alkoxy groups, aryl groups, for example tolyl, silyl groups or silyloxy groups, fluorinated or partially fluorinated alkyl groups, electron-withdrawing groups, such as fluorine, nitro or nitrile, or substituents for increasing the glass transition temperature (Tg) in the polymer, in particular bulky groups, such as, for example, t-butyl.

In a further embodiment of the present invention, it is preferred for $L^1$ and $L^2$ to represent a single covalent bond.

In still a further embodiment of the present invention, it is preferred for W to be selected from the group consisting of C, Si and Ge. W is particularly preferably a carbon atom.

In still a further embodiment of the present invention, it is preferred for one representative from U and V to represent a single covalent bond and for the other representative to represent a unit $CR^1R^2$— as described above.

In still a further embodiment of the present invention, it is preferred for $Ar^1$ and $Ar^2$ to represent a 6- to 14-membered, optionally substituted aromatic ring system. In accordance with the invention, the term "6- to 14-membered, optionally substituted aromatic ring system" is intended to encompass all compounds which fall under the number-of-atoms sub-set of the term defined as "5- to 25-membered, optionally substituted aromatic ring system". These ring systems are preferably phenyl, naphthyl, anthracyl and phenanthryl, particularly preferably phenyl and naphthyl, especially preferably phenyl.

In still a further embodiment of the present invention, it is preferred for one, two or all three representatives from $Ar^3$, $Ar^4$ and $Ar^5$ to be, independently of one another, an optionally substituted $C_{6-14}$-aryl group. In accordance with the invention, the term "$C_{6-14}$-aryl group" is intended to encompass all compounds which fall under the number-of-atoms sub-set of the term defined as "$C_{6-40}$-aryl group". These ring systems are preferably phenyl, naphthyl, anthracyl and phenanthryl, particularly preferably phenyl and naphthyl, especially preferably phenyl.

All non-preferred and preferred constituents of the above-mentioned embodiments can be combined with one another as desired in accordance with the invention. These combinations are likewise part of the present invention.

A further preferred embodiment according to the invention is a polymer which contains at least one structural unit of the following formulae (IVa), (IVb) and/or (IVc):

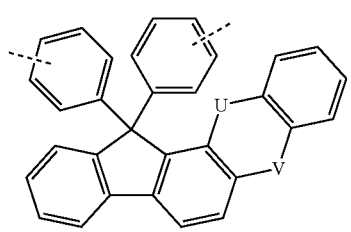

formula (IVa)

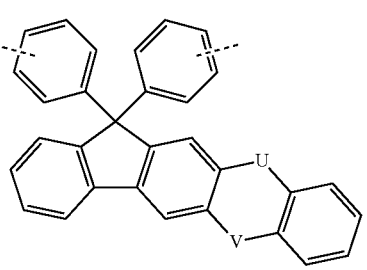

formula (IVb)

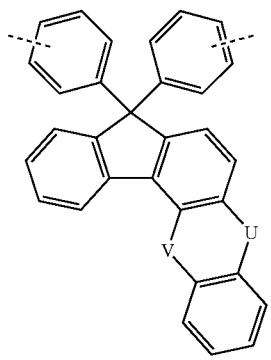

formula (IVc)

where the dashed lines, U and V have the same meanings as defined in the above-mentioned embodiments and preferred embodiments. The bonds denoted by the dashed lines represent bonds in the ortho-, meta- or para-position on the corresponding phenyl rings. The meta- and para-positions are preferred. It is also preferred for one representative from U and V to represent a single covalent bond and for the other representative to be $CR_1R_2$.

A further particularly preferred embodiment is thus a polymer which contains at least one structural unit of the following formulae (Va) and/or (Vb):

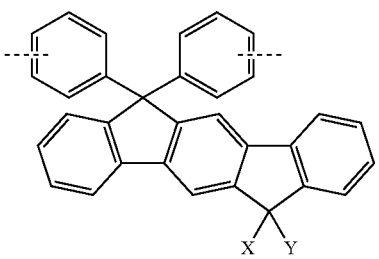

formula (Va)

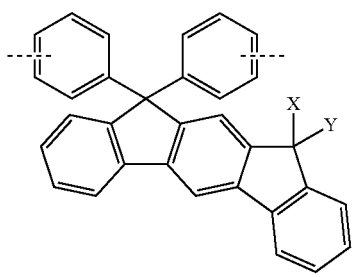

formula (Vb)

where the dashed lines have the same meanings as in the above embodiments, and X and Y have the same meanings as $R^1$ and $R^2$.

In the present application, the term "polymer" is taken to mean both polymeric compounds, oligomeric compounds and dendrimers. The polymeric compounds according to the invention preferably have 10 to 10,000, particularly preferably 20 to 5000 and in particular 50 to 2000 structural units. The oligomeric compounds according to the invention preferably have 2 to 9 structural units. The branching factor of the polymers here is between 0 (linear polymer, no branching sites) and 1 (fully branched dendrimer).

In a further embodiment of the present invention, it is preferred for the dashed lines to represent, independently of one another, a bond to a further structural unit in the polymer. In this case, the structural unit according to the invention serves to interrupt conjugated units in the polymer. Consequently, the polymers according to the invention are preferably either partially conjugated or non-conjugated polymers. Non-conjugated polymers are particularly preferred.

In a further embodiment according to the invention, the proportion of the units of the formula (I) in the polymer is up to 100 mol %, preferably up to 95 mol %, particularly preferably up to 80 mol % and in particular up to 60 mol %. Likewise in a preferred embodiment, the proportion of the units of the formula (I) in the polymer is at least 0.01 mol %, preferably at least 1 mol %, particularly preferably at least 10 mol % and in particular at least 30 mol %.

Partially conjugated polymers can be random copolymers or block copolymers comprising the structural unit according to the invention and at least one further structural unit. Groups which can be employed as further structural unit are described below. In the case of partially conjugated polymers, at least one of the further structural units (monomer units) which is different from the structural unit according to the invention contributes to the polymer forming a conjugated system in parts. Examples which may be mentioned of a monomer which results in a structural unit of this type in the polymer are -(Ph)- and -(p-Ph)-(p-Ph)- (Ph=phenylene). The partial conjugation is thus based on the conjugation of a part-section being interrupted by the incorporation of the structural unit of the formula (I) according to the invention.

However, it is particularly preferred with respect to the emission efficiency of triplet emitters that the polymer is non-conjugated. In the case of the non-conjugated polymer, the polymer can be a homopolymer comprising the structural units of the formula (I). However, the non-conjugated polymer may also be a random or alternating copolymer or block copolymer comprising the structural unit of the formula (I) and at least one further structural unit which is different from the structural unit according to the invention. In the case of the random copolymer and the block copolymer, the further structural units are preferably units which are themselves non-conjugated or whose conjugation is interrupted by a short non-aromatic unit (<10% of the atoms other than H, preferably <5% of the atoms other than H), such as, for example, C ($sp^3$-hybridised), N, O, Si, P, S, Ge (e.g.: $CR_2$, C=O, NR, O, $SiR_2$, P=O, S and $GeR_2$, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group). In the case of the alternating copolymer, the further structural units may also be units which are conjugated per se.

In a further embodiment of the present invention, the polymers according to the invention may also, besides one or more structural units of the formula (I), contain further structural units which are different from the structural unit of the formula (I). These are, inter alia, those as disclosed and listed extensively in WO 02/077060 A1 and in WO 2005/014689 A2. These are incorporated into the present application by way of reference. The further structural units can originate, for example, from the following classes:

Group 1: Units which enhance the hole-injection and/or hole-transport properties of the polymers;
Group 2: Units which enhance the electron-injection and/ or electron-transport properties of the polymers;
Group 3: Units which have combinations of individual units from group 1 and group 2;

Group 4: Units which modify the emission characteristics to such an extent that electrophosphorescence can be obtained instead of electrofluorescence;

Group 5: Units which improve transfer from the singlet state to the triplet state;

Group 6: Units which influence the emission colour of the resultant polymers;

Group 7: Units which are typically used as backbone;

Group 8: Units which influence the film-morphological and/or rheological properties of the resultant polymers.

Preferred polymers according to the invention are those in which at least one structural unit has charge-transport properties, i.e. which contain units from groups 1 and/or 2.

Structural units from group 1 which have hole-injection and/or hole-transport properties are, for example, triarylamine, benzidine, tetraaryl-para-phenylene-diamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.9 eV (against vacuum level), particularly preferably less than −2.5 eV.

It may be preferred for the polymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4, so-called triplet emitter units, are those which are able to emit light from the triplet state with high efficiency, even at room temperature, i.e. exhibit electrophosphorescence instead of electrofluorescence, which frequently causes an increase in the energy efficiency. For the purposes of the present application, a triplet emitter unit is taken to mean a compound which comprises a triplet emitter. For the purposes of the present application, triplet emitters are taken to mean all compounds which are capable of emitting light in the visible or NIR region through transfer from a triplet state into an energetically lower state. This is also referred to as phosphorescence. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1 and EP 1239526 A2. Corresponding monomers are described in WO 02/068435 A1 and in WO 2005/042548 A1.

It is preferred in accordance with the invention to employ triplet emitters which emit in the visible spectral region (red, green or blue).

The triplet emitter may be part of the backbone of the polymer (i.e. in the main chain of the polymer) or it may be located in a side chain of the polymer.

Structural units from group 5 are those which improve transfer from the singlet state to the triplet state and which, employed in support of the above-mentioned triplet emitter units, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenylene, 4,4''-bisstyrylarylene, benzothiadiazole and corresponding oxygen derivatives, quinoxaline, phenothiazine, phenoxazine, dihydrophenazine, bis(thiophenyl)arylene, oligo-(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but in principle also all similar structures which, after polymerisation, would result in a conjugated, bridged or unbridged polyphenylene or polyphenylene-vinylene homopolymer. Here too, the said aromatic structure may contain heteroatoms, such as O, S or N, in the backbone or a side chain.

Structural units from group 8 are those which influence the film-morphological properties and/or the rheological properties of the polymers, such as, for example, siloxanes, long alkyl chains or fluorinated groups, but also particularly rigid or flexible units, such as, for example, liquid crystal-forming units or crosslinkable groups.

The synthesis of the above-described units from groups 1 to 8 and of the further emitting units is known to the person skilled in the art and is described in the literature, for example in WO 2005/014689 A2, WO 2005/030827 A1 and WO 2005/

030828 A1. These documents and the literature cited therein are incorporated into the present application by way of reference.

Preference is given to polymers according to the invention which simultaneously additionally contain one or more units selected from groups 1 to 8 besides structural units of the formula (I). It may furthermore be preferred for more than one structural unit from one group to be present simultaneously.

However, a smaller proportion of the emitting units, in particular green- and red-emitting units, may also be preferred, for example for the synthesis of white-emitting copolymers. The way in which white-emitting copolymers can be synthesised is described in detail, for example, in WO 2005/030827 A1 and WO 2005/030828 A1.

Preference is given here to polymers according to the invention which, besides at least one structural unit of the formula (I), also contain units from group 7. The sum of structural units of the formula (I) and units from group 7 in the polymer is particularly preferably at least 50 mol %, based on all units in the polymer.

It is likewise preferred for the polymers according to the invention to contain units which improve the charge transport and/or charge injection, i.e. units from groups 1 and/or 2; a proportion of 0.5 to 30 mol % of these units is particularly preferred; a proportion of 1 to 10 mol % of these units is very particularly preferred.

It is furthermore particularly preferred for the polymers according to the invention to contain structural units from group 7 and units from groups 1 and/or 2. The sum of structural units of the formula (I), units from group 7 and units from groups 1 and/or 2 in the polymer is particularly preferably at least 50 mol %, based on all units in the polymer, where 0.5 to 30 mol % of units are preferably from groups 1 and/or 2.

The way in which the above-mentioned copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the polymer may also have dendritic structures.

The polymers according to the invention containing structural units of the formula (I) are accessible readily and in high yields.

If triplet emitter units are employed in the polymers according to the invention, they have advantageous properties, in particular long lifetimes, high efficiencies and good colour coordinates.

The polymers according to the invention are generally prepared by polymerisation of one or more types of monomer, of which at least one monomer results in structural units of the formula (I) in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the group of the SUZUKI coupling, the YAMAMOTO coupling and the STILLE coupling, and the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, for example in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterisation of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

For the synthesis of the polymers according to the invention, the corresponding monomers are required. Monomers which result in structural units of the formula (I) in the polymers according to the invention are compounds which are correspondingly substituted and have, in two positions, suitable functionalities which allow this monomer unit to be incorporated into the polymer. These monomers are novel and are therefore likewise a subject-matter of the present application.

Accordingly, the present invention also relates to compounds of the following formula (VI):

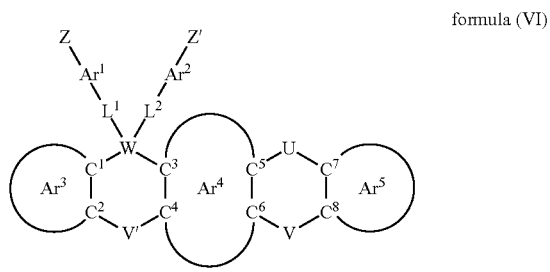

formula (VI)

where the symbols used have the following meanings:
Z and Z' are selected, independently of one another, from the group consisting of halogen, O-tosylate, O-triflate, O—SO$_2$R$^3$, B(OR$^3$)$_2$ and Sn(R$^3$)$_3$, where R$^3$ selected on each occurrence, independently of one another, from the group consisting of H, an aliphatic hydrocarbon radical having 1 to 20 C atoms and an aromatic hydrocarbon radical having 5 to 20 ring atoms, and where two or more radicals R$^3$ may also form an aliphatic ring system with one another; and where the other symbols have the same meanings as in the above embodiments. The preferred embodiments of the structural unit of the formula (I) are again preferred embodiments here.

In the present application, halogen is taken to mean fluorine, chlorine, bromine or iodine, where chlorine, bromine and iodine are preferred, and bromine and iodine are particularly preferred.

In a further embodiment of the present invention, Z and Z' in the compounds of the formula (VI) are selected, independently of one another, from Br, I and $B(OR^3)_2$.

In the present application, the term "aliphatic hydrocarbon radical having 1 to 20 carbon atoms" is taken to mean a saturated or unsaturated, non-aromatic hydrocarbon radical, which may be linear, branched or cyclic. One or more carbon atoms may have been replaced by O, N or S. In addition, one or more hydrogen atoms may have been replaced by fluorine. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl, where methyl, ethyl, i-propyl and i-butyl are particularly preferred.

In the present application, the term "aromatic hydrocarbon radical having 5 to 20 ring atoms" is taken to mean an aromatic ring system having 6 to 20 carbon atoms or a heteroaromatic ring system having 5 to 20 ring atoms, where one or more of the ring atoms are intended to be a heteroatom selected from N, O and S and the others are carbon atoms. For the purposes of the present application, these definitions are also intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C ($sp^3$-hybridised), N, O, Si, P, S, Ge (e.g.: $CR_2$, C=O, NR, O, $SiR_2$, P=O, S and $GeR_2$, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group). In addition, they may also be monocyclic or polycyclic, i.e. they may have one ring (for example phenyl) or two or more rings, which may also be condensed (for example naphthyl) or covalently linked (for example biphenyl), or contain a combination of condensed and linked rings. Fully conjugated aryl groups are preferred.

It may additionally be preferred to use the polymers according to the invention not as the pure substance, but instead as a mixture together with further polymeric, oligomeric, dendritic or low-molecular-weight substances of any desired type. These may, for example, improve the electronic properties or themselves emit. Above and below, a mixture is taken to mean a composition which comprises at least one polymeric component.

The present invention thus furthermore relates to a polymer mixture which comprises one or more polymers according to the invention and one or more further polymeric, oligomeric, dendritic or low-molecular-weight substances.

In a further embodiment of the present invention, it is preferred for a mixture to comprise a polymer according to the invention and a low-molecular-weight substance. The low-molecular-weight substance is preferably a triplet emitter.

In a further embodiment, it is preferred for the polymer which contains structural units of the formula (I) to be employed in an emitting layer together with an emitting compound. In this case, the polymer is preferably employed in combination with one or more phosphorescent materials (triplet emitters). For the purposes of the present application, phosphorescence is taken to mean the luminescence from an excited state of relatively high spin multiplicity, i.e. a spin state >1, in particular from an excited triplet state or from an MLCT mixed state. The mixture comprising the polymer according to the invention or the preferred embodiment mentioned above and the emitting compound then comprises between 99 and 1% by weight, preferably between 98 and 60% by weight, particularly preferably between 97 and 70% by weight, in particular between 95 and 75% by weight, of the polymer according to the invention or of the preferred embodiment mentioned above, based on the entire mixture comprising emitter and matrix material. Correspondingly, the mixture comprises up to 99% by weight, preferably up to 40% by weight, particularly preferably up to 30% by weight and in particular up to 25% by weight, of the emitter, based on the entire mixture comprising emitter and matrix material. In addition, the mixture comprises at least 1% by weight, preferably 2% by weight, particularly preferably at least 3% by weight and in particular at least 5% by weight, of the emitter, based on the entire mixture comprising emitter and matrix material.

In the above-mentioned embodiment in which the polymer which contains structural units of the formula (I) is employed in an emitting layer together with an emitting compound, the proportion of the emitting compound may, however, also be significantly lower. In this case, the mixture preferably comprises at least 0.01% by weight of the emitter, based on the entire mixture, but preferably less than 5% by weight, particularly preferably less than 3% by weight and in particular less than 1.5% by weight of the emitter, based on the entire mixture.

Suitable phosphorescent compounds are, in particular, compounds which emit light, preferably in the visible region, on suitable excitation and in addition contain at least one atom having an atomic number of greater than 36 and less than 84, particularly preferably greater than 56 and less than 80.

Examples of the emitters described above are revealed by the applications WO 00/70655, WO 01/41512, WO 02/02714, WO 02/15645, EP 1191613, EP 1191612, EP 1191614, WO 05/033244 and DE 102008015526. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without an inventive step.

For the purposes of the present application, the emitter compound in the composition according to the invention is preferably a green-emitting triplet emitter. The triplet emitter may likewise be a blue or red triplet emitter.

In a further embodiment according to the invention, the triplet emitter preferably contains an organometallic connecting unit. The organometallic connecting unit is preferably an organometallic coordination compound. In the present application, an organometallic coordination compound is taken to mean a compound having a metal atom or ion in the centre of the compound surrounded by an organic compound as ligand. In addition, an organometallic coordination compound is characterised in that at least one carbon atom of the ligand is bonded to the central metal via a coordination bond. Electrically neutral triplet emitters are furthermore preferred.

The triplet emitters preferably contain only chelating ligands, i.e. ligands which coordinate to the metal via at least two bonding sites; the use of two or three bidentate ligands, which may be identical or different, is particularly preferred. The preference for chelating ligands is due to the higher stability of chelate complexes.

The triplet emitter preferably has a structure of the formula (VII):

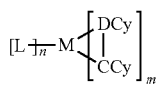

formula (VII)

where the following applies to the symbols and indices used:
M is on each occurrence, identically or differently, a main-group metal, transition metal or lanthanoid having an atomic number >36;
DCy is on each occurrence, identically or differently, a cyclic group which contains at least one donor atom, i.e. an atom having a free electron pair, preferably nitrogen or phosphorus, via which the cyclic group is bonded to the metal, and which may carry one or more substituents $R^4$; the groups DCy and CCy are connected to one another via a covalent bond and may have further links to one another via the radicals $R^4$ and/or $R^5$;
CCy is on each occurrence, identically or differently, a cyclic group which contains a carbon atom via which the cyclic group is bonded to the metal, and which may carry one or more substituents $R^4$;
L is on each occurrence, identically or differently, a bidentate-chelating ligand, preferably a monoanionic, bidentate-chelating ligand;
$R^4$ is on each occurrence, identically or differently, H, F, Cl, Br, I, $NO_2$, CN, a straight-chain, branched or cyclic alkyl or alkoxy group having 1 to 40 C atoms, where one or more non-adjacent $CH_2$ groups may be replaced by C=O, C=S, C=Se, C=$NR^5$, —$R^5$C=$CR^5$—, —C≡C—, —O—, —S—, —$NR^5$—, $Si(R^5)_2$ or —$CONR^5$— and where one or more H atoms may be replaced by F, Cl, Br, I, CN, $NO_2$, or an aromatic or heteroaromatic ring system having 5 to 40 aromatic ring atoms, which may be substituted by one or more non-aromatic radicals $R^4$; a plurality of substituents $R^4$ here, both on the same ring and also on the two different rings, may together in turn form a further mono- or polycyclic, aliphatic or aromatic ring system;
$R^5$ is, identically or differently on each occurrence, H, an aliphatic hydrocarbon radical having 1 to 20 C atoms or an aromatic hydrocarbon radical having 6 to 20 C atoms;
m is on each occurrence 1, 2 or 3, preferably 2 or 3, particularly preferably 3;
n is on each occurrence 0, 1 or 2, preferably 0 or 1, particularly preferably 0.

Preference is likewise given to multinuclear triplet emitters and metal clusters whose common feature is more than one metallic centre.

The units of the formula (VII) may have a symmetrical or asymmetrical structure.

In a preferred embodiment of the invention, the units of the formula (VII) have a symmetrical structure. This preference is due to the easier synthetic accessibility of the compounds. Thus, units of the formula (VII) may preferably be homoleptic metal complexes, i.e. metal complexes which have only one type of ligand.

In a further preferred embodiment of the invention, the units of the formula (VII) have an asymmetrical structure. This may offer advantages in the case of the emission properties if the emission only comes from one of the ligands. Thus, units of the formula (VII) may preferably be heteroleptic complexes, i.e. metal complexes which have more than one different ligand.

Preferred metals M are selected from the group of the transition metals having an atomic number >36; particularly preferred metals M are selected from the group of the transition metals having an atomic number >50. The emitter compound is preferably a metal complex containing a metal selected from the group consisting of the transition metals, the rare earths, the lanthanoids and the actinoids, preferably Ir, Ru, Os, Eu, Au, Pt, Cu, Zn, Mo, W, Rh, Pd and Ag, particularly preferably Ir.

It is furthermore preferred for the organic ligand to be a chelate ligand. A chelate ligand is taken to mean a bi- or polydentate ligand, which may correspondingly bond to the central metal via two or more atoms.

In a further embodiment according to the invention, it is preferred for a mixture to comprise a polymer according to the invention, a triplet emitter, which is either present in the polymer according to the invention or, as in the above-mentioned embodiments, has been admixed as low-molecular-weight substance, and further low-molecular-weight substances. These low-molecular-weight substances may have the same functionalities as mentioned for possible monomer units from groups 1 to 8.

The present invention furthermore relates to solutions and formulations comprising one or more polymers or mixtures according to the invention in one or more solvents. The way in which solutions of this type can be prepared is known to the person skilled in the art and is described, for example, in WO 02/072714 A1, WO 03/019694 A2 and the literature cited therein.

These solutions can be used to produce thin polymer layers, for example by area-coating processes (for example spin coating) or by printing processes (for example ink-jet printing).

Polymers which contain structural units of the formula (I) which contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to polymers according to the invention containing one or more polymerisable groups, preferably selected from acrylate, methacrylate, vinyl, epoxy and oxetane. It is possible here not only to use corresponding polymers as the pure substance, but also to use formulations or blends of these polymers as described above. These can be used with or without addition of solvents and/or binders. Suitable materials, processes and devices for the methods described above are described, for example, in WO 2005/083812 A2. Possible binders are, for example, polystyrene, polycarbonate, polyacrylates, polyvinylbutyral and similar, opto-electronically neutral polymers.

Suitable and preferred solvents are, for example, toluene, anisoles, xylenes, methyl benzoate, dimethylanisoles, mesitylenes, tetralin, veratrols and tetra-hydrofuran or mixtures thereof.

The polymers, mixtures and formulations according to the invention can be used in electronic or electro-optical devices or for the production thereof.

The present invention thus furthermore relates to the use of the polymers, mixtures and formulations according to the invention in electronic or electro-optical devices, preferably in organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLEDs, PLEDs), in particular in polymeric organic electroluminescent devices (PLEDs).

The way in which OLEDs or PLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in PLEDs or displays produced in this way.

For the purposes of the present invention, electroluminescent materials are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or mixtures according to the invention in a PLED, in particular as electroluminescent material.

The present invention furthermore relates to electronic or opto-electronic components, preferably organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably organic or polymeric organic electroluminescent devices, in particular polymeric organic electroluminescent devices, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to PLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the Claims, unless stated otherwise elsewhere.

WORKING EXAMPLES

Examples 1 and 2

Preparation of the Monomers

Example 1

Preparation of Compound 4

Compound 4 is prepared as follows:

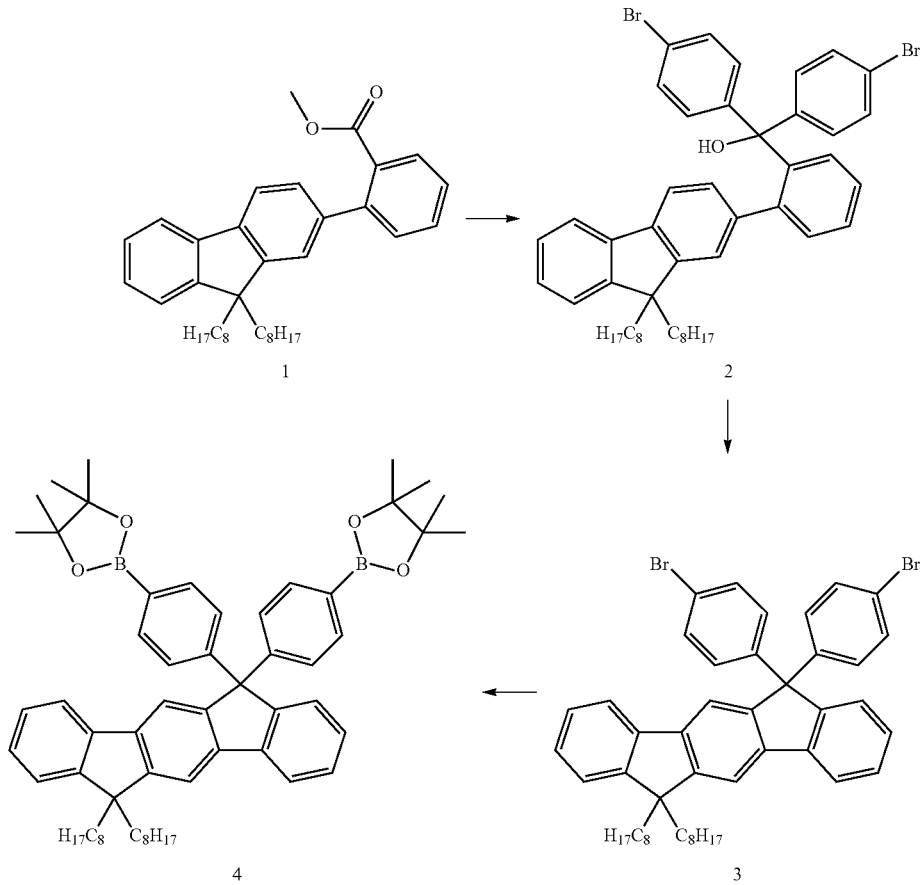

1.1 Compound 2

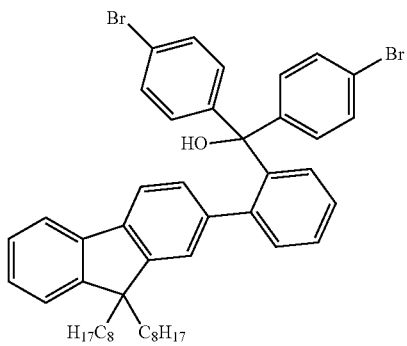

104.3 g (2 molar equivalents, 0.442 mol) of 1,4-dibromobenzene are initially introduced in 300 ml of THF and cooled to −75° C. in an acetone/dry-ice bath. 117 ml (2 molar equivalents, 0.442 mol) of n-butyllithium (2.5 M in hexane) are added dropwise at such a rate that the internal temperature does not exceed −69° C., and the mixture is subsequently stirred at −72° C. for a further 1 hour. 116 g (1 molar equivalent, 0.221 mol) of compound 1 are then dissolved in 220 ml of THF and slowly added dropwise at −72° C. at such a rate that the internal temperature does not exceed −69° C. The reaction solution is stirred at −70° C. for a further hour and at room temperature overnight.

120 ml of 50% acetic acid are added to the batch. The phases are separated. The aqueous phase is extracted with heptane. The combined organic phases are extracted with $H_2O$, dried over $Na_2SO_4$, filtered and evaporated under reduced pressure.

$^1$H NMR (CDCl$_2$, δ (ppm), J (Hz)): 0.51 (s broad, 4H), 0.81 (t, 6H, J=7.25), 0.94-1.25 (m, 20H), 1.55-1.85 (m, 4H), 6.73 (d, 1H, J=8.0), 6.87-6.90 (m, 2H), 6.95-7.05 (m broad, 4H), 7.21 (d, 1H, J=7.55), 7.24 (d, 1H, J=7.75), 7.28-7.36 (m, 4H), 7.42 (d, 4H, J=8.6), 7.56 (d, 1H, 7.75), 7.66-7.68 (m, 1H)

1.2 Compound 3

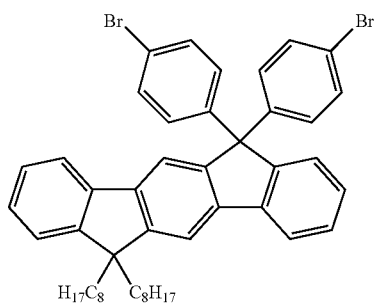

177.4 g (1 molar equivalent, 0.22 mol) of compound 2 are dissolved in 353.2 ml (2.8 molar equivalents, 6.1 mol) of acetic acid and warmed to reflux. 19.6 ml (1.1 molar equivalents, 0.24 mol) of concentrated hydrochloric acid are added under reflux, and the mixture is heated under reflux for 1.5 hours. After a TLC check (heptane/ethyl acetate), 2×2 ml of concentrated hydrochloric acid are metered in, reaction time 3 hours. When the reaction is complete, 25 ml of water are carefully added. A further 50 ml of water are subsequently added for phase separation. The mixture is extracted with dichloromethane, and the combined organic phases are then extracted with water and NaHCO$_3$, dried over sodium sulfate, filtered and evaporated under reduced pressure.

The purification is carried out by recrystallisation (acetonitrile/toluene) and gives a white solid (99%).

$^1$H NMR (CDCl$_2$, δ (ppm), J (Hz)): 0.65-0.75 (m, 4H), 0.79 (t, 6H, J=7.25), 0.99-1.25 (m, 20H), 1.98-2.01 (m, 4H), 7.10 (d, 4H, J=8.75), 7.26-7.29 (m, 3H), 7.33-7.41 (m, 7H), 7.57 (s, 1H), 7.60-7.62 (m, 1H), 7.71 (s, 1H), 7.84 (d, 1H, 7.55)

1.3 Compound 4

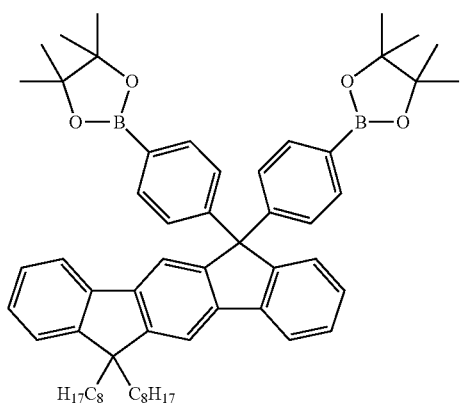

250 ml of dioxane, 19.33 g (2 molar equivalents, 0.076 mol) of bis(pinacolato)-diborane and 10.83 g (2.9 molar equivalents, 0.11 mol) of potassium acetate are added to 30 g (1 molar equivalent, 0.038 mol) of compound 3. 1.11 g (1.4 mmol) of 1,1-bis(diphenylphosphino)ferrocenepalladium(II) chloride (complex with dichloromethane (1:1), Pd 13%) are subsequently added. The batch is heated to 110° C. After a TLC check, the batch is cooled to room temperature, and 200 ml of water are added. A further 50 ml of water are subsequently added for phase separation. The mixture is extracted with ethyl acetate, and the combined organic phases are then dried over sodium sulfate, filtered and evaporated under reduced pressure.

The purification is carried out via a column (heptane/ethyl acetate) and by recrystallisation (heptane) and gives a white solid (100%).

$^1$H NMR (CDCl$_2$, δ (ppm), J (Hz)): 0.65-0.75 (m, 4H), 0.80 (t, 6H, J=7.25), 0.99-1.23 (m, 20H), 1.28 (s, 24H), 1.98-2.01 (m, 4H), 7.23 (d, 4H, J=8.2), 7.26-7.28 (m, 3H), 7.32-7.34 (m, 1H), 7.37-7.40 (m, 2H), 7.57-7.59 (m, 1H), 7.62 (s, 1H), 7.68 (d, 4H, J=8.25), 7.71 (s, 1H), 7.84 (d, 1H, 7.40)

Example 2
Preparation of Compound 9
Compound 9 is prepared as follows:
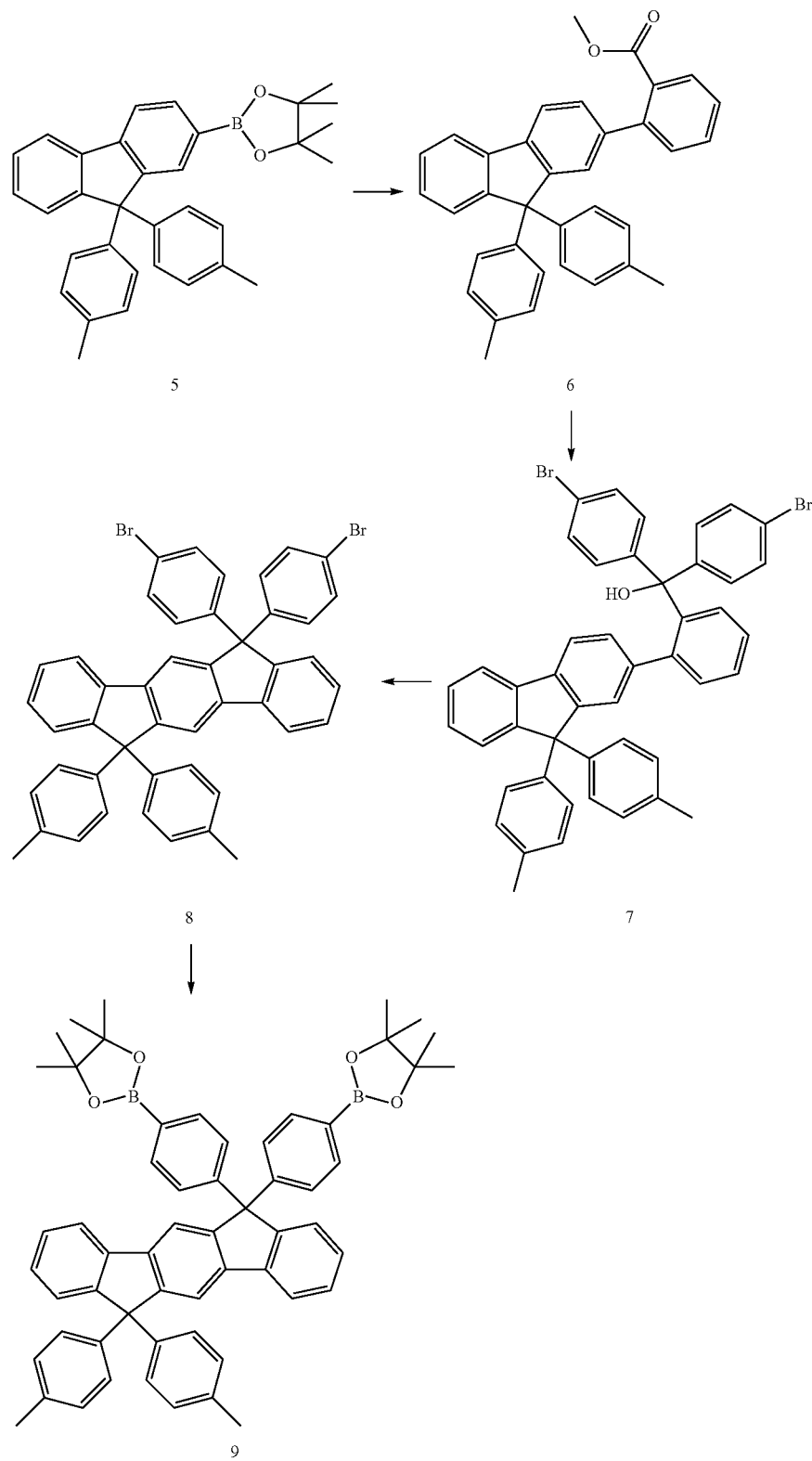

2.1 Compound 6

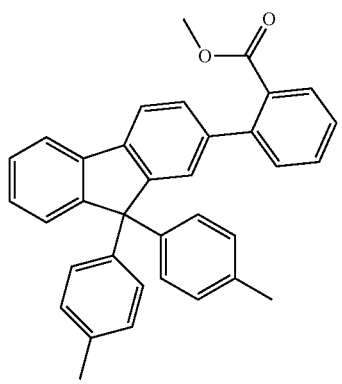

52.5 g (1 molar equivalent, 0.111 mol) of ditolylfluoreneboronic acid, 46.2 g (3 molar equivalents, 0.333 mol) of potassium carbonate and 17.3 ml (1.1 molar equivalents, 0.123 mol) of 2-bromomethyl benzoate are initially introduced, and 130 ml of toluene and 130 ml of H$_2$O are added. 142 mg of Pd(PPh$_3$)$_4$ are subsequently added. The mixture is stirred under reflux until the reaction is complete. After a TLC check, the batch is cooled to room temperature, and 200 ml of water are added. The organic phase is separated off and extracted with toluene. The combined organic phases are dried over sodium sulfate, filtered and evaporated under reduced pressure.

$^1$H NMR (CDCl$_2$, δ (ppm), J (Hz)): 2.29 (s, 6H), 3.34 (s, 3H), 7.03 (d, 4H, J=8.25), 7.09 (d, 4H, J=8.25), 7.27-7.31 (m, 2H), 7.37-7.42 (m, 4H), 7.44 (d, 1H, 7.70), 7.52 (t, 1H, 7.55), 7.75 (d, 1H, 7.75), 7.80-7.83 (m, 2H).

2.2 Compound 7

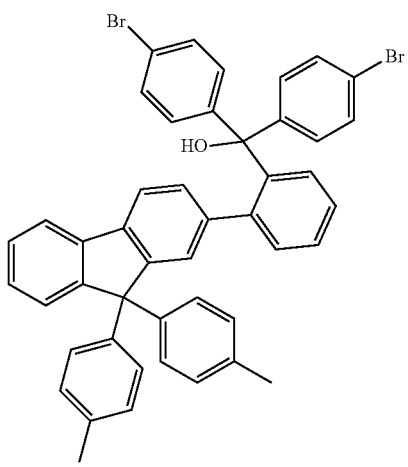

53.0 g (2 molar equivalents, 0.224 mol) of 1,4-dibromobenzene are initially introduced in 200 ml of THF and cooled to –75° C. in an acetone/dry-ice bath. 89.9 ml (2 molar equivalents, 0.224 mol) of n-butyllithium (2.5 M in hexane) are added dropwise at such a rate that the internal temperature does not exceed –69° C., and the mixture is subsequently stirred at –72° C. for a further 1 hour. 54 g (1 molar equivalent, 0.112 mol) of compound 6 are then dissolved in 150 ml of THF and slowly added dropwise at –72° C. at such a rate that the internal temperature does not exceed –69° C. The reaction solution is stirred at –70° C. for a further hour and at room temperature overnight.

120 ml of 50% acetic acid are added to the batch. The phases are separated. The aqueous phase is extracted with heptane. The combined organic phases are extracted with H$_2$O, dried over Na$_2$SO$_4$, filtered and evaporated under reduced pressure.

2.3 Compound 8

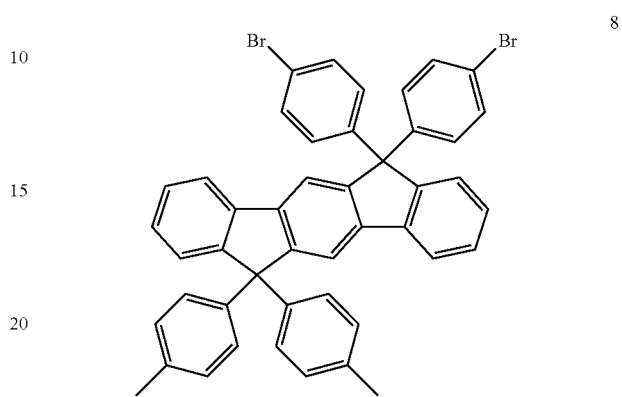

80.0 g (1 molar equivalent, 0.105 mol) of compound 7 are dissolved in 168.5 ml (28 molar equivalents, 2.9 mol) of acetic acid and warmed to reflux. 9.4 ml (1.1 molar equivalents, 0.115 mol) of concentrated hydrochloric acid are added under reflux, and the mixture is heated under reflux for 1.5 hours. After a TLC check (heptane/ethyl acetate), 2×2 ml of concentrated hydrochloric acid are metered in, reaction time 3 hours. When the reaction is complete, 25 ml of water are carefully added. A further 50 ml of water are subsequently added for phase separation. The mixture is extracted with dichloromethane, and the combined organic phases are then extracted with water and NaHCO$_3$, dried over sodium sulfate, filtered and evaporated under reduced pressure.

The purification is carried out by recrystallisation (dioxane/toluene) and gives a white solid (99%).

$^1$H NMR (CDCl$_2$, δ (ppm), J (Hz)): 2.23 (s, 6H), 6.98 (d, 4H, J=8.05), 7.03-7.06 (m, 8H), 7.17-7.21 (m, 2H), 7.24-7.31 (m, 7H), 7.33 (d, 1H, 7.95), 7.58 (s, 1H), 7.61 (d, 2H, 7.55), 7.68 (s, 1H).

2.4 Compound 9

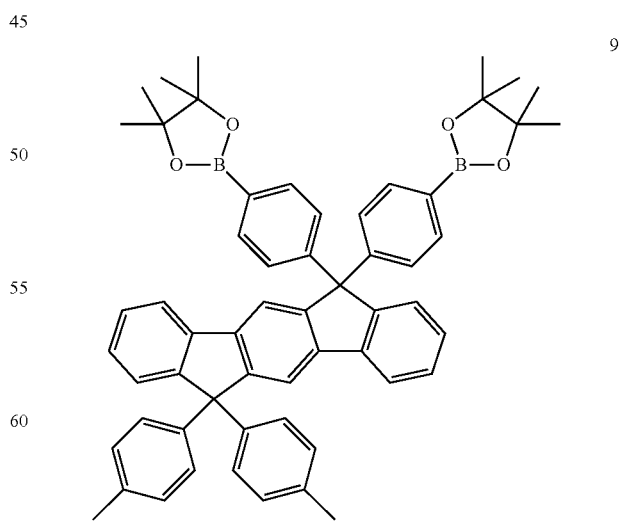

250 ml of dioxane, 13.65 g (2 molar equivalents, 0.054 mol) of bis(pinacolato)-diborane and 7.64 g (2.9 molar equivalents, 0.078 mol) of potassium acetate are added to 20.0 g (1 molar equivalent, 0.027 mol) of compound 8. 0.79 g (0.96 mmol) of 1,1-bis(diphenylphosphino)ferrocenepalladium(II) chloride (complex with dichloromethane (1:1), Pd 13%) is subsequently added. The batch is heated to 110° C. After a TLC check, the batch is cooled to room temperature, and 200 ml of water are added. A further 50 ml of water are subsequently added for phase separation. The mixture is extracted with ethyl acetate, and the combined organic phases are then dried over sodium sulfate, filtered and evaporated under reduced pressure.

The purification is carried out via a column (heptane/dichloromethane) and by recrystallisation from ethyl acetate and gives a white solid (99.9%).

$^1$H NMR (CDCl$_2$, δ (ppm), J (Hz)): 1.30 (s, 24H), 2.31 (s, 6H), 7.05 (d, 4H, J=8.25), 7.14 (d, 4H, J=8.25), 7.22-7.27 (m, 6H), 7.31-7.35 (m, 2H), 7.37 (d, 1H, 7.75), 7.40 (d, 1H, 7.55), 7.66-7.70 (m, 6H), 7.72 (s, 1H), 7.75 (s, 1H).

Examples 3 to 10

Preparation of the Polymers

Polymers P1 and P2 according to the invention and comparative polymer C1 are synthesised using the following monomers (percentage data=mol %) by SUZUKI coupling in accordance with WO 03/048225 A2.

Example 3

Polymer P1

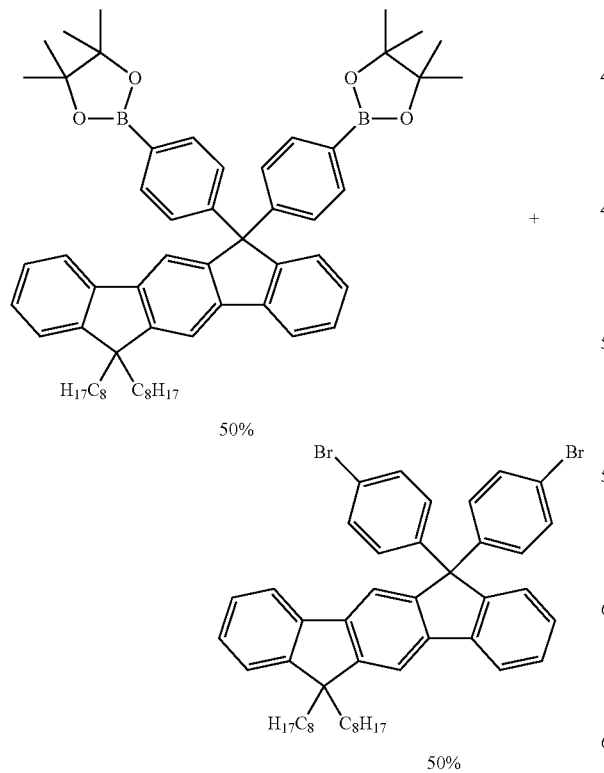

Example 4

Polymer P2

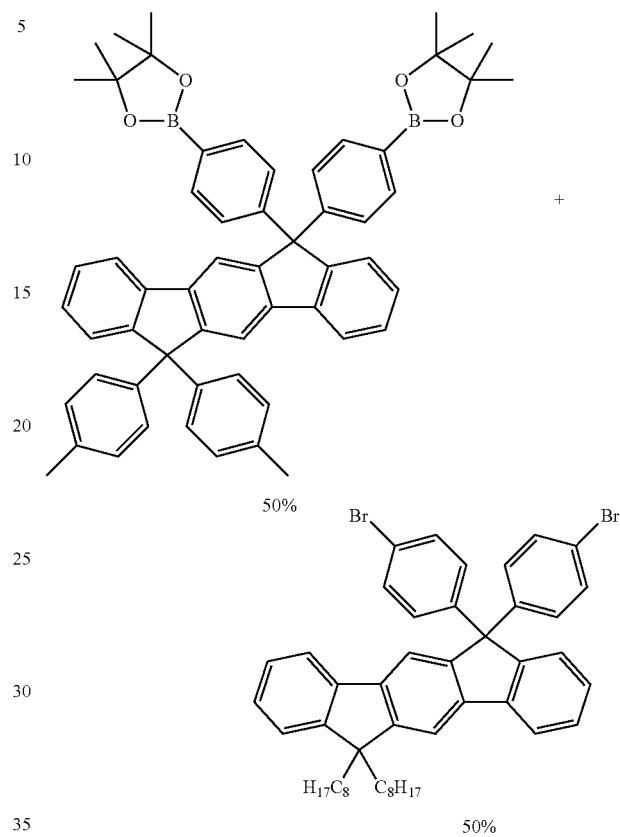

Example 5

Comparative Polymer C1

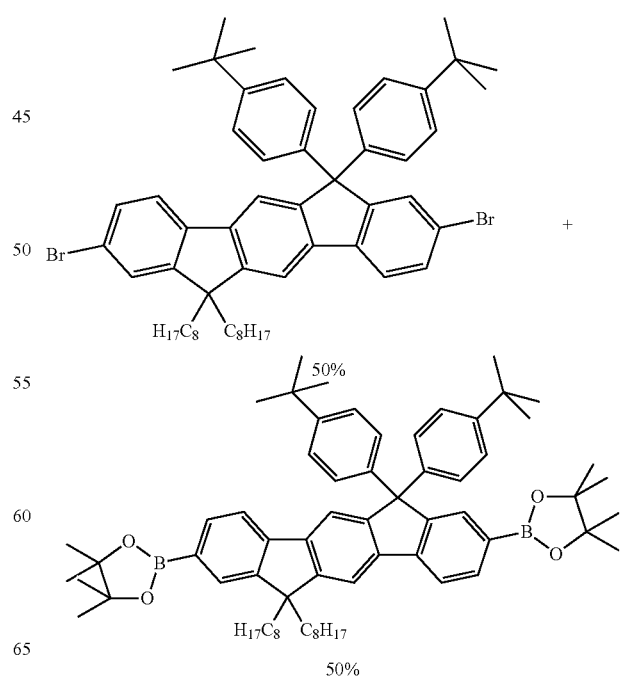

Films of a soluble, green triplet emitter T1 in polymers P1, P2 and C1 are produced with the aid of a spin coater (see also device examples).

T1

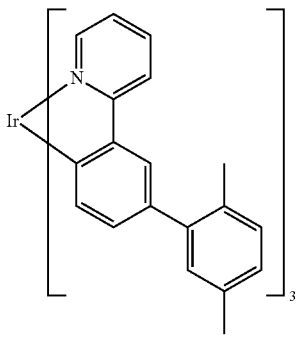

The film thickness is 80 nm, the emitter concentration is 20% by weight. PL spectra of these films are measured at an excitation wavelength of 345 nm in a Hitachi PL spectrometer (model F-4500). All spectra are measured at the same settings (gap width 5 nm, pre-voltage 700 V, scanning rate 240 nm/min). The spectra are shown in FIG. 1. It is clearly evident that a high PL quantum efficiency of the green triplet emitter is achieved with the aid of the polymer matrices according to the invention, whereas the blue emission from the polymer dominates in the comparative polymer and virtually no emission from the triplet emitter is detectable.

Examples 6 and 7

Polymers P1 and P2 are very highly suitable for demonstrating the basic suitability of the components according to the invention in matrices for green triplet emission, but they contain no additional units which could contribute to hole or electron transport. Further polymers, in this case copolymers, which already contain the triplet emitter are therefore synthesised. Polymer P3 contains a conjugation-interrupted backbone, comparative polymer C2 a conjugated backbone.

Example 6

Polymer P3

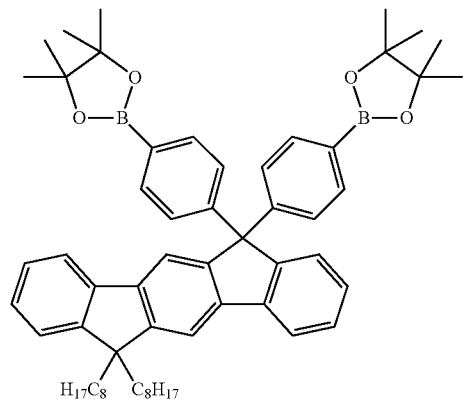

50%

+

-continued

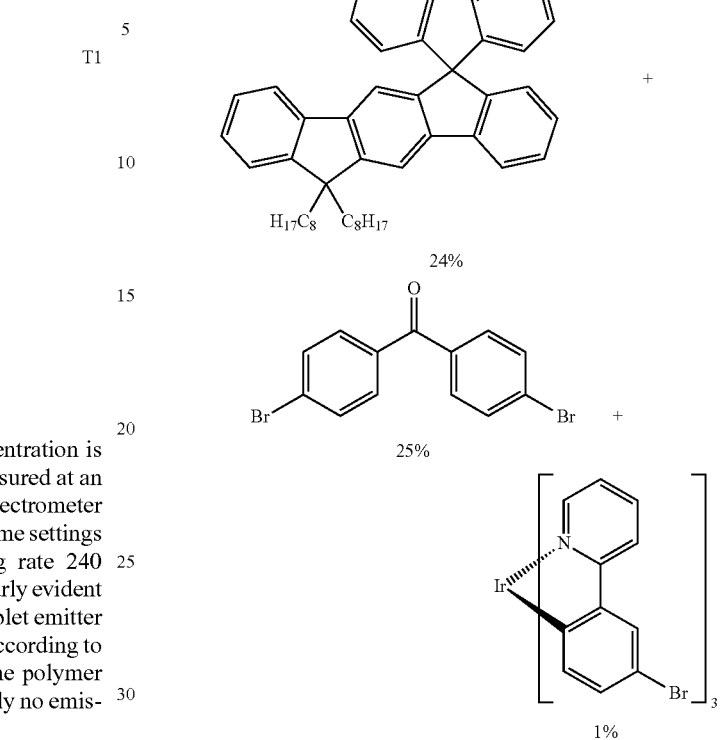

24%

+

25%

+

1%

Example 7

Comparative Polymer C2

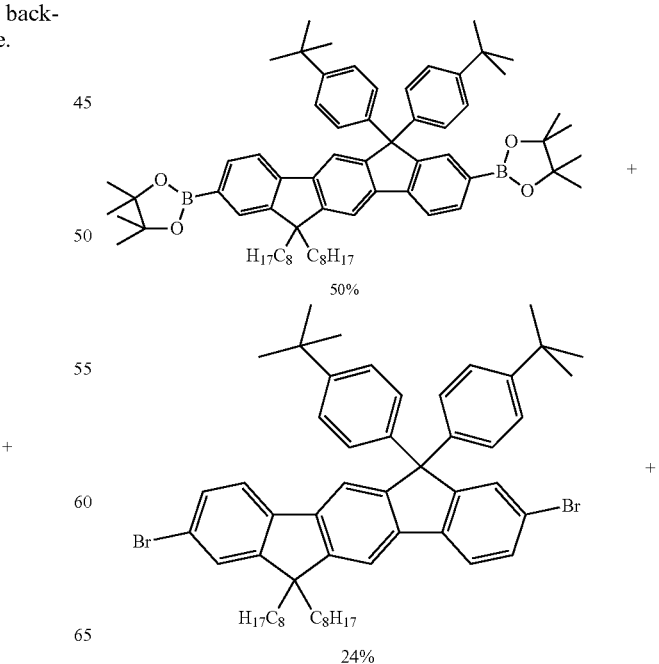

50%

+

24%

Examples 8 to 10

As already explained in the case of polymers P1 and P2 according to the invention, a triplet device can also be produced by combination of a triplet emitter with a matrix. Polymers P4 to P6 are polymers according to the invention containing additional functional units (from group 1 or 2, see Description).

Example 8

Polymer P4

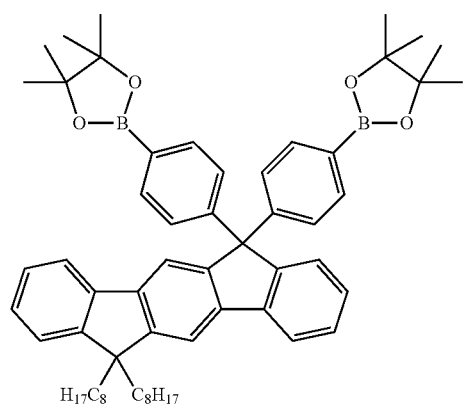

50%

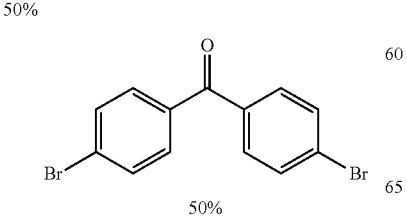

50%

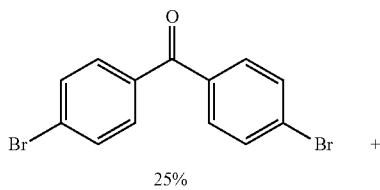

25% +

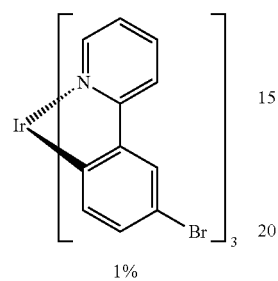

1%

Example 9

Polymer P5

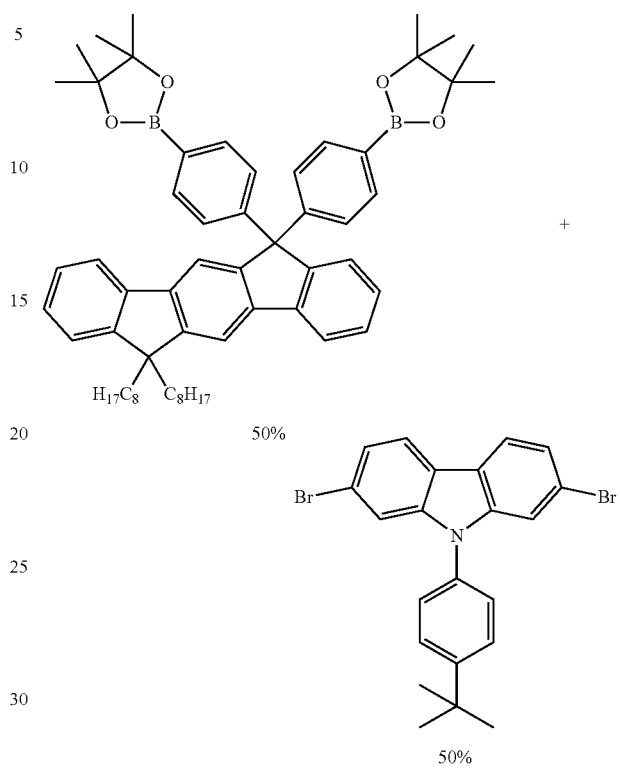

50%

+

50%

Example 10

Polymer P6

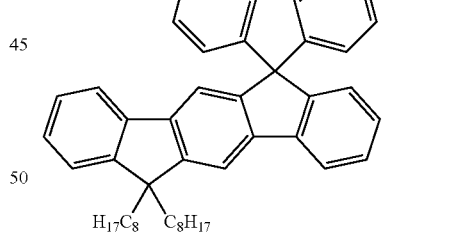

50%

+

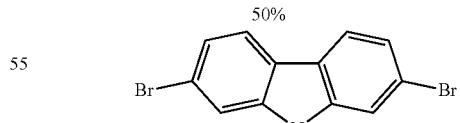

+

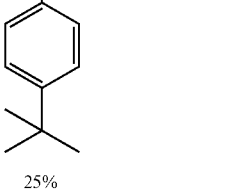

25%

-continued

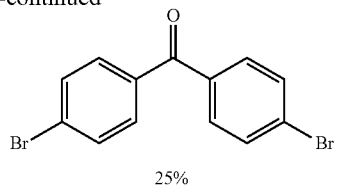

25%

Example 11

Polymer P7

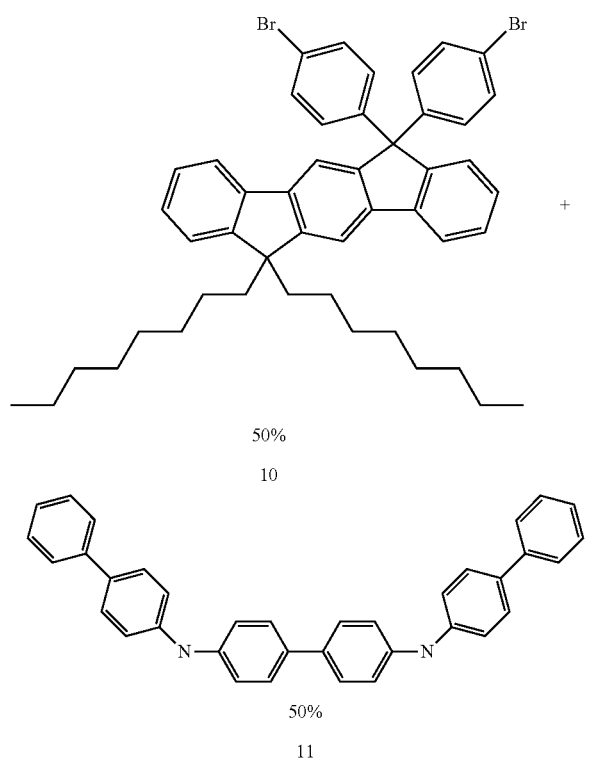

50%

10

50%

11

1.577 g (2 mmol) of monomer 10 and 0.977 g (2 mmol) of monomer 11, as well as 0.577 g (6 mmol) of sodium tert-butoxide are dissolved in 20 ml of toluene. The reaction solution obtained is carefully degassed under argon. The solution is warmed to about 80° C. under a protective-gas atmosphere, and the reaction is initiated by addition of 3.6 mg (16 µmol) of palladium acetate and 69 mg (96 µmol) of tri-tert-butylphosphine dissolved in 1 ml of toluene. The reaction mixture is heated at the boil for about 1 hour until the solution becomes viscous. The polymerisation is terminated by addition of 3 mg of bromobiphenyl, and the reaction solution is heated at the boil for a further hour in order to terminate the end groups. The solution is cooled to 65° C. and diluted with 80 ml of toluene, 80 ml of a 10% thiocarbamide solution are added, and the mixture is stirred at 65° C. for 3 hours. The mixture is cooled to room temperature and extracted three times with 50 ml of water and subsequently precipitated in double the amount of methanol. For purification, the polymer is dissolved in toluene and subsequently precipitated in double the amount of methanol. This procedure is repeated again.

Examples 12 to 17

Production of PLEDs

Figure 2:
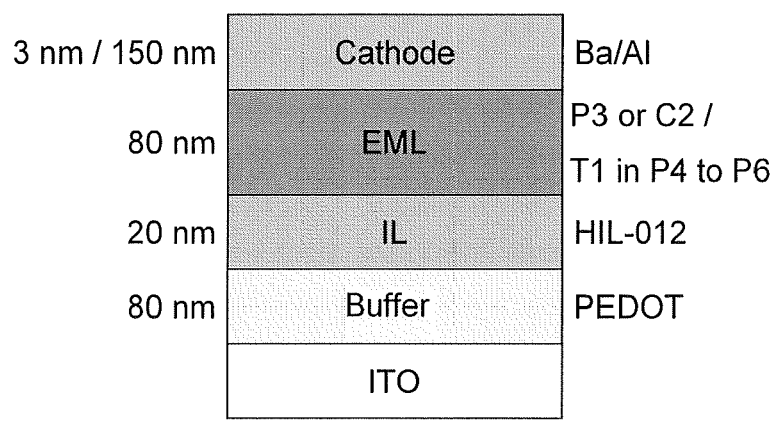
FIG. 2 illustrates a typical device having a cathode, EML, Il, buffer and ITO layers.

A polymeric organic light-emitting diode (PLED) is produced as already described many times in the literature (for example in WO 2004/037887 A2). In order to explain the present invention in illustrative terms, PLEDs are produced with polymers P3 to P6 and comparative polymer C2 by spin coating. A typical device has the structure depicted in FIG. 2.

Figure 3:
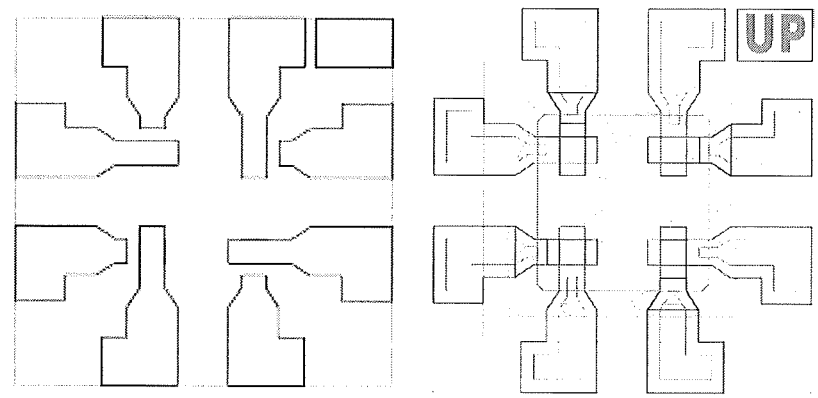
FIG. 3 illustrates manufactured substrates from Technoprint are used in a layout design.

To this end, specially manufactured substrates from Technoprint are used in a layout designed specifically for this purpose (FIG. 3, diagram on the left: ITO structure applied to the glass support, diagram on the right: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in a clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (nitrogen or argon), firstly 20 nm of an interlayer (typically a hole-dominated polymer, here HIL-012 from Merck) and then 80 nm of the polymer layers are applied from toluene solutions (concentration 5 g/l of interlayer, between 8 and 10 g/l for polymers P3 to P6 and C2). Both layers are dried by heating at 180° C. for at least 10 minutes. The Ba/Al cathode is then vapour-deposited in the pattern indicated through a vapour-deposition mask (high-purity metals from Aldrich, particularly barium 99.99% (Order No. 474711); vapour-deposition units from Lesker or others, typical vacuum level $5 \times 10^{-6}$ mbar). Finally, the device is encapsulated in order to protect, in particular, the cathode against air and atmospheric moisture and is then characterised.

Figure 4:
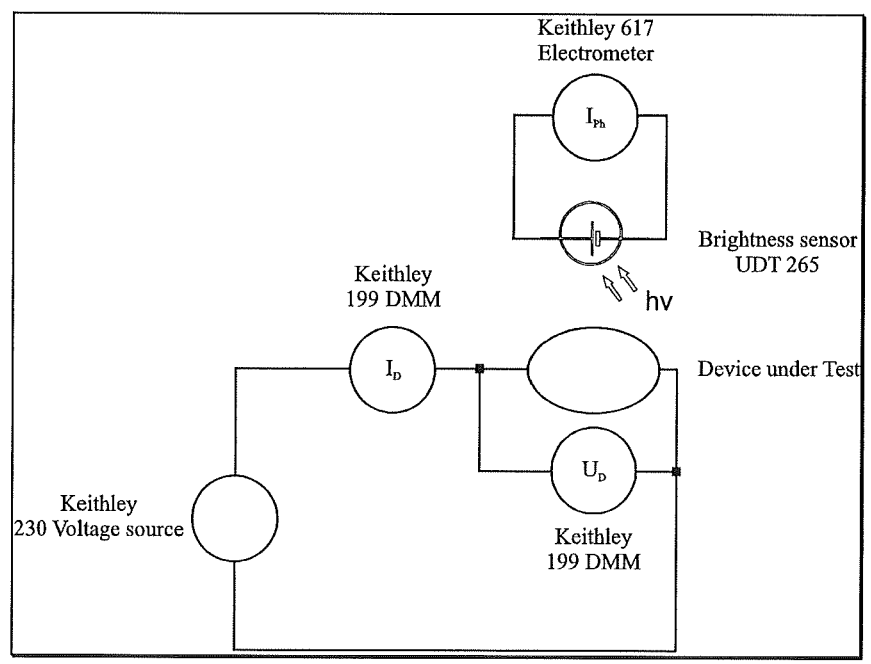
FIG. 4 illustrates a typical measurement set-up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 4.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m².

In order, in addition, to know the colour and the precise electroluminescence spectrum of the test devices, the voltage required for 100 cd/m² is applied again after the first measurement, and the photodiode is replaced by a spectrum measurement head. This is connected to a spectrometer (Ocean Optics) by an optical fibre. The colour coordinates (CIE: Commission Internationale de l'Éclairage, standard observer from 1931) can be derived from the measured spectrum.

The results obtained on use of polymers P3 to P6 and C2 in PLEDs are summarised in Table 1. For P3 and C2, the polymer alone is dissolved in toluene, while in the case of the other polymers according to the invention, a soluble, green triplet emitter T1 is also dissolved in a concentration of 20% by weight, and a film comprising the two components is produced (for example 2.5 g/l of T1, 10 g/l of polymer). In Example 17, the two polymers P4 and P5 are weighed out in equal parts, i.e. the concentrations are 2.5 g/l of T1, 5 g/l of P4 and 5 g/l of P5.

TABLE 1

| Ex. | Inter-layer | Polymer | Max. eff. [cd/A] | Max. eff. [lm/W] | U @ 100 cd/m² [V] | U @ 1000 cd/m² [V] | CIE [x/y] |
| --- | --- | --- | --- | --- | --- | --- | --- |
| 12 | HIL-012 | P3 | 20.0 | 5.8 | 7.5 | 9.6 | 0.39/0.58 |
| 13 | HIL-012 | C2 | 0.4 | | 6.6 | not poss. | 0.34/0.35 |
| 14 | HIL-012 | P4 | 28.4 | 18.3 | 5.3 | 7.4 | 0.35/0.61 |
| 15 | HIL-012 | P5 | 15.0 | 3.8 | 9.1 | 10.9 | 0.35/0.61 |
| 16 | HIL-012 | P6 | 31.1 | 14.6 | 5.8 | 8.2 | 0.34/0.62 |
| 17 | HIL-012 | P4 + P5 | 36.1 | 20.2 | 4.8 | 7.2 | 0.34/0.61 |

As can be seen from the results, polymers P3 to P6 represent a significant improvement over the comparable polymers in accordance with the prior art, where a measurement up to 1000 cd/m² was not even possible.

P7 is used as interlayer instead of HIL-012. The results (Ex. 18 to 20), which are summarised in Table 2, show an at least 20% greater power efficiency in combination with P4 to P6.

TABLE 2

| Ex. | Interlayer | Polymer | Max. eff. [lm/W] | U @ 100 cd/m² [V] | CIE [x/y] |
| --- | --- | --- | --- | --- | --- |
| 18 | P7 | P4 | 22.5 | 4.4 | 0.35/0.61 |
| 19 | P7 | P5 | 5.0 | 8.9 | 0.35/0.61 |
| 20 | P7 | P6 | 17.8 | 5.0 | 0.34/0.62 |

The invention claimed is:

1. A polymer for use as a matrix material in electroluminescent device which consists essentially of a structural unit of the formula (I):

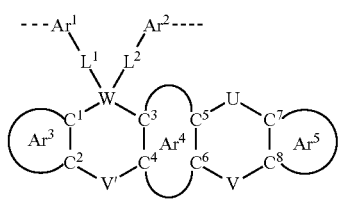

formula (I)

where the symbols and indices used have the following meanings:

the dashed lines represent, independently of one another, a bond to a further structural unit of the polymer;

$L^1$ and $L^2$ represent, independently of one another, or a unit selected from the group consisting of a $C_{1-10}$-alkylene group, $C_{2-10}$-alkenylene group, $C_{2-10}$-alkynylene group and $Si_{1-10}$-silylene group, where one or more $CH_2$ units is optionally replaced by NR, O or S and one or more $SiH_2$ units is optionally replaced by O;

W represents a tetravalent unit selected from the group consisting of C, Si, Ge and a structural element of the following formulae (II) and (III):

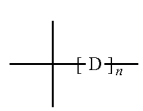

formula (II)

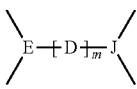

formula (III)

where

D is, identically or differently on each occurrence, a unit selected from the group consisting of $CR_2$, O, S and NR, E and J are each, independently of one another, units selected from the group consisting of CR and N, n is 1, 2 or 3, and m is 0, 1 or 2; where R is a radical selected from the group consisting of H, F and $C_{1-6}$-alkyl;

with the proviso that only one representative from E, D and J is different from CR or $CR_2$;

where, in the case where the tetravalent unit W is a unit of the formula (II) or (III), $C^1$ and $C^3$ are bonded to different atoms of the unit W;

U, V and V' represent, independently of one another, a single covalent bond or a divalent unit selected from the group consisting of $CR^1R^2$, C=O, $NR^1$, O, $SiR^1R^2$, P=O, S and $GeR^1R^2$;

where $R^1$ and $R^2$ are selected, independently of one another, from the group consisting of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;

$C^1$ to $C^8$ each represent a C atom;

$Ar^1$ and $Ar^2$ each represent, independently of one another, a 5- to 25-membered, optionally substituted aromatic or heteroaromatic ring system;

$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$.

2. The polymer according to claim 1, wherein U, V and V' represent, independently of one another, a single covalent bond or $CR^1R^2$.

3. A process for the preparation of the polymer according to claim 1, which comprises preparing the polymer by SUZUKI, YAMAMOTO, STILLE or HARTWIG-BUCHWALD polymerization.

4. A mixture comprising the polymer according to claim 1 with a low-molecular-weight substance which is a triplet emitter.

5. A solution comprising the mixture according to claim 4 in one or more solvents.

6. A solution comprising the polymer according to claim 1 in one or more solvents.

7. A polymer for use as a matrix material in electroluminescent device which consists essentially of a structural unit of the formula (I):

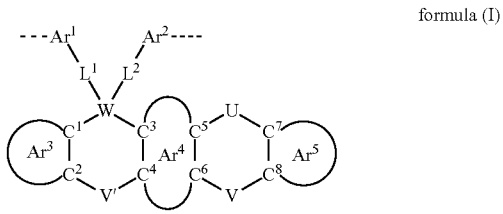

formula (I)

where the symbols and indices used have the following meanings:
the dashed lines represent, independently of one another, a bond to a further structural unit of the polymer;
$L^1$ and $L^2$ represent, independently of one another, a single covalent bond or a unit selected from the group consisting of a $C_{1-10}$-alkylene group, $C_{2-10}$-alkenylene group, $C_{2-10}$-alkynylene group and $Si_{1-10}$-silylene group, where one or more $CH_2$ units is optionally replaced by NR, O or S and one or more $SiH_2$ units is optionally replaced by O;
W represents a tetravalent unit selected from the group consisting of C, Si, Ge— and a structural element of the following formulae (II) and (III):

formula (II)

formula (III)

where
D is, identically or differently on each occurrence, a unit selected from the group consisting of $CR_2$, O, S and NR,
E and J are each, independently of one another, units selected from the group consisting of CR and N,
n is 1, 2 or 3, and
m is 0, 1 or 2; where
R is a radical selected from the group consisting of H, F and $C_{1-6}$-alkyl;
with the proviso that only one representative from E, D and J is different from CR or $CR_2$;
where, in the case where the tetravalent unit W is a unit of the formula (II) or (III), $C^1$ and $C^3$ are bonded to different atoms of the unit W;
U, V and V' represent, independently of one another, a divalent unit selected from the group consisting of $CR^1R^2$, C=O, $NR^1$, O, $SiR^1R^2$, P=O, S and $GeR^1R^2$;
where
$R^1$ and $R^2$ are selected, independently of one another, from the group consisting of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;
$C^1$ to $C^8$ each represent a C atom;
$Ar^1$ and $Ar^2$ each represent, independently of one another, a 5- to 25-membered, optionally substituted aromatic or heteroaromatic ring system;
$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$.

8. A process for the preparation of the polymer according to claim 7, which comprises preparing the polymer by SUZUKI, YAMAMOTO, STILLE or HARTWIG-BUCHWALD polymerization.

9. A mixture comprising the polymer according to claim 7 with a low-molecular-weight substance which is a triplet emitter.

10. A solution comprising the mixture according to claim 9 in one or more solvents.

11. A solution comprising the polymer according to claim 7 in one or more solvents.

12. The polymer according to claim 7, wherein U, V and V' represent, independently of one another, a single covalent bond or $CR^1R^2$.

13. An electronic device having at least one emitting layer which comprises
a polymer which consists essentially of a structural unit of the formula (I):

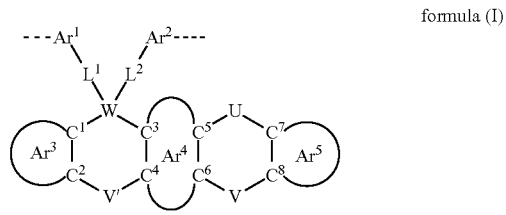

formula (I)

where the symbols and indices used have the following meanings:
the dashed lines represent, independently of one another, a bond to a further structural unit of the polymer;
$L^1$ and $L^2$ represent a single covalent bond
W represents a tetravalent unit selected from the group consisting of C,
U, V and V' represent, independently of one another, a single covalent bond or a divalent unit selected from the group consisting of $CR^1R^2$, C=O, $NR^1$, O, $SiR^1R^2$, P=O, S and $GeR^1R^2$;
where
$R^1$ and $R^2$ are selected, independently of one another, from the group consisting of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;
$C^1$ to $C^8$ each represent a C atom;
$Ar^1$ and $Ar^2$ each represent, independently of one another, a 5- to 25-membered, optionally substituted aromatic or heteroaromatic ring system;
$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$, as a host material for green triplet materials and one triplet emitter.

14. The electronic device as claimed in claim 13, wherein one representative from U and V represents a single covalent bond and the other represents the unit $CR^1R^2$.

15. The electronic device as claimed in claim 13, wherein the structural unit is a structural unit of the formulae (Va) and/or (Vb):

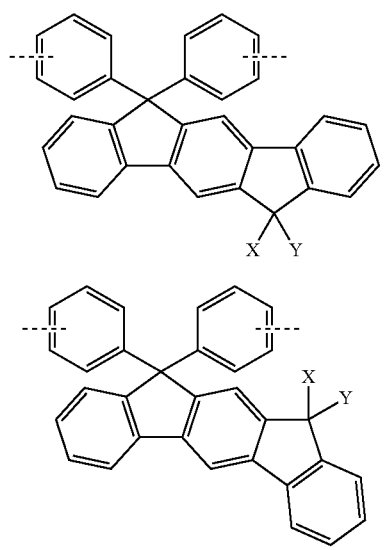

formula (Va)

formula (Vb)

wherein the dashed lines represent, independently of one another, a bond to a further structural unit of the polymer;

X and Y have the same meanings as $R^1$ and $R^2$.

16. The electronic device as claimed in claim 13, wherein the polymer is a partially conjugated polymer, where the conjugation is interrupted by the structural unit of the formula (I).

17. The electronic device as claimed in claim 13, wherein, besides the structural unit of the formula (I), the polymer also contains at least one further structural unit.

18. An organic electroluminescent device having at least one emitting layer which comprises
a polymer which consists essentially of a structural unit of the formula (I):

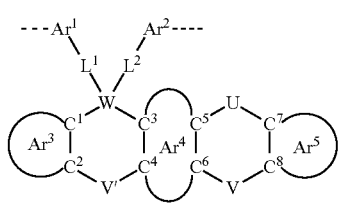

formula (I)

where the symbols and indices used have the following meanings:
the dashed lines represent, independently of one another, a bond to a further structural unit of the polymer;
$L^1$ and $L^2$ represent a single covalent bond W represents a tetravalent unit selected from the group consisting of C, U, V and V' represent, independently of one another, a single covalent bond or a divalent unit selected from the group consisting of $CR^1R^2$, C=O, $NR^1$, O, $SiR^1R^2$, P=O, S and $GeR^1R^2$;

where $R^1$ and $R^2$ are selected, independently of one another, from the group consisting of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;

$C^1$ to $C^8$ each represent a C atom;

$Ar^1$ and $Ar^2$ each represent, independently of one another, a 5- to 25-membered, optionally substituted aromatic or heteroaromatic ring system;

$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$, as a host material for green triplet materials and one triplet emitter.

19. The organic electronic device according to claim 18, wherein the device is an organic or polymeric organic electroluminescent device (OLED, PLED), an organic integrated circuit (O-IC), an organic field-effect transistor (OFET), an organic thin-film transistor (OTFT), an organic solar cell (O-SC), an organic laser diode (O-laser), an organic photovoltaic (OPV) element or device or an organic photoreceptor (OPC).

20. The organic electronic device according to claim 19, wherein the device is a polymeric organic electroluminescent device (PLED).

21. The organic electroluminescent device according to claim 18, wherein one representative from U and V represents a single covalent bond and the other represents the unit $CR^1R^2$.

22. The organic electroluminescent device according to claim 18, wherein the structural unit is a structural unit of the formulae (Va) and/or (Vb):

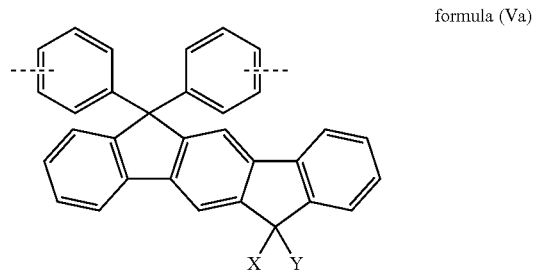

formula (Va)

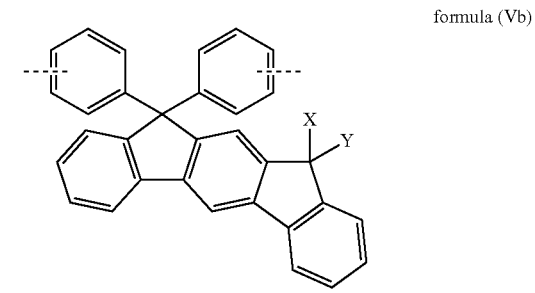

formula (Vb)

wherein the dashed lines represent, independently of one another, a bond to a further structural unit of the polymer;

X and Y have the same meanings as $R^1$ and $R^2$.

23. The organic electroluminescent device according to claim 18, wherein the polymer is a partially conjugated polymer, where the conjugation is interrupted by the structural unit of the formula (I).

24. The organic electroluminescent device according to claim 18, besides the structural unit of the formula (I), the polymer also contains at least one further structural unit.

* * * * *